(12) United States Patent
Deboy et al.

(10) Patent No.: US 8,829,946 B2
(45) Date of Patent: *Sep. 9, 2014

(54) CIRCUIT FOR DRIVING A TRANSISTOR DEPENDENT ON A MEASUREMENT SIGNAL

(75) Inventors: Gerald Deboy, Klagenfurt (AT); Karl Norling, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/597,887

(22) Filed: Aug. 29, 2012

(65) Prior Publication Data

US 2013/0147523 A1 Jun. 13, 2013

Related U.S. Application Data

(63) Continuation-in-part of application No. 12/241,882, filed on Sep. 30, 2008, now Pat. No. 8,299,820.

(51) Int. Cl.
*H03K 3/00* (2006.01)
(52) U.S. Cl.
USPC .......................................... 327/108; 327/112
(58) Field of Classification Search
USPC .................................. 327/108–112
See application file for complete search history.

(56) References Cited

U.S. PATENT DOCUMENTS

| | | | |
|---|---|---|---|
| 2,463,384 A | 3/1949 | August | |
| 3,997,892 A | 12/1976 | Susset | |
| 5,371,420 A | 12/1994 | Nakao | |
| 5,416,361 A | 5/1995 | John et al. | |
| 5,680,132 A | 10/1997 | Kobatake | |
| 5,808,504 A | 9/1998 | Chikai et al. | |
| 6,054,890 A | 4/2000 | Giacomo | |
| 6,307,495 B1 | 10/2001 | Mahant-Shetti et al. | |
| 6,555,996 B2 | 4/2003 | Drori et al. | |
| 6,608,612 B2 | 8/2003 | Kokubun et al. | |
| 6,903,597 B2 | 6/2005 | Tai | |
| 7,064,023 B2 | 6/2006 | Koyama et al. | |

(Continued)

FOREIGN PATENT DOCUMENTS

| DE | 19958234 | 6/2001 |
|---|---|---|
| DE | 202007009332 | 2/2008 |

(Continued)

OTHER PUBLICATIONS

Non-Final Office Action mailed Nov. 30, 2011 in U.S. Appl. No. 12/241,882.

(Continued)

*Primary Examiner* — Kenneth B. Wells
(74) *Attorney, Agent, or Firm* — Dicke, Billig & Czaja, PLLC

(57) ABSTRACT

One aspect is a circuit having an input configured to receive an input signal, and an actuation output configured to be connected to an actuation terminal of a transistor. A measurement arrangement is configured to ascertain at least one of a load current through a load path of the transistor, and a load voltage across the load path of the transistor and to provide a measurement signal that is dependent on at least one of the load current and the load path voltage. An actuation current source is configured to receive the measurement signal and to provide an actuation current at the actuation output, the actuation current having a current level dependent on the measurement signal.

16 Claims, 12 Drawing Sheets

(56) References Cited

U.S. PATENT DOCUMENTS

| | | |
|---|---|---|
| 7,202,711 B2 | 4/2007 | Gose et al. |
| 7,205,821 B2 | 4/2007 | Rutter |
| 7,236,020 B1 | 6/2007 | Virgil |
| 7,236,041 B2 | 6/2007 | Kim et al. |
| 7,245,163 B2 | 7/2007 | Nakamura |
| 7,248,084 B2 | 7/2007 | Huang et al. |
| 7,250,810 B1 * | 7/2007 | Tsen et al. ............ 327/536 |
| 7,504,980 B2 | 3/2009 | Shimizu et al. |
| 7,554,385 B2 | 6/2009 | Ishida |
| 7,570,085 B2 | 8/2009 | Ishikawa et al. |
| 7,583,111 B2 | 9/2009 | Galvano |
| 7,586,340 B2 | 9/2009 | Lin et al. |
| 7,639,050 B2 | 12/2009 | Chigira |
| 7,656,202 B2 | 2/2010 | Kaiho et al. |
| 7,733,255 B2 | 6/2010 | Christ |
| 8,299,820 B2 * | 10/2012 | Deboy .................. 327/108 |

FOREIGN PATENT DOCUMENTS

| | | |
|---|---|---|
| EP | 2012432 | 1/2009 |
| GB | 2417149 | 2/2006 |
| GB | 2440771 | 2/2008 |

OTHER PUBLICATIONS

Non-Final Office Action mailed Aug. 23, 2010 in U.S. Appl. No. 12/241,882.

Non-Final Office Action mailed Apr. 7, 2010 in U.S. Appl. No. 12/241,882.

* cited by examiner

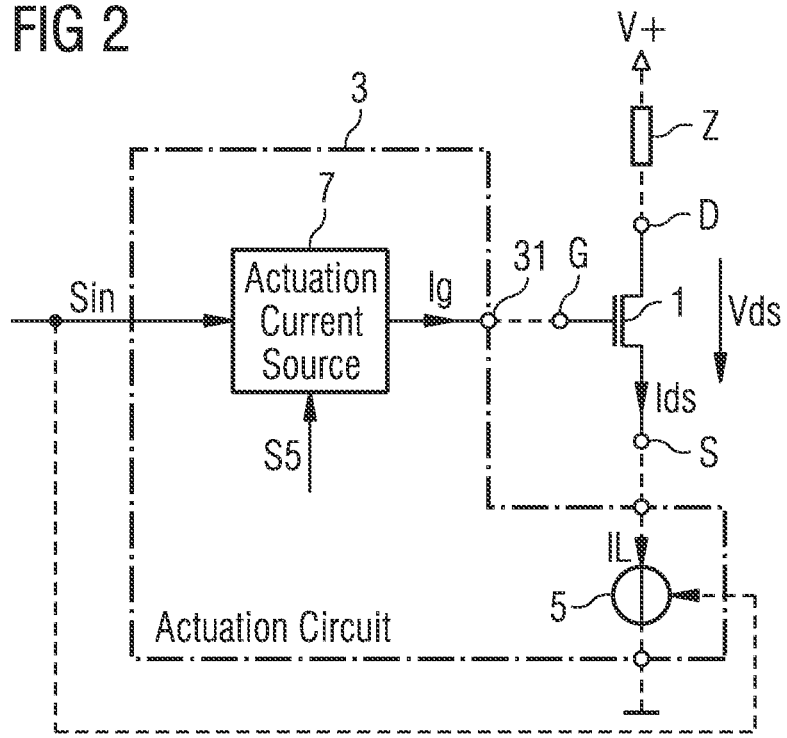
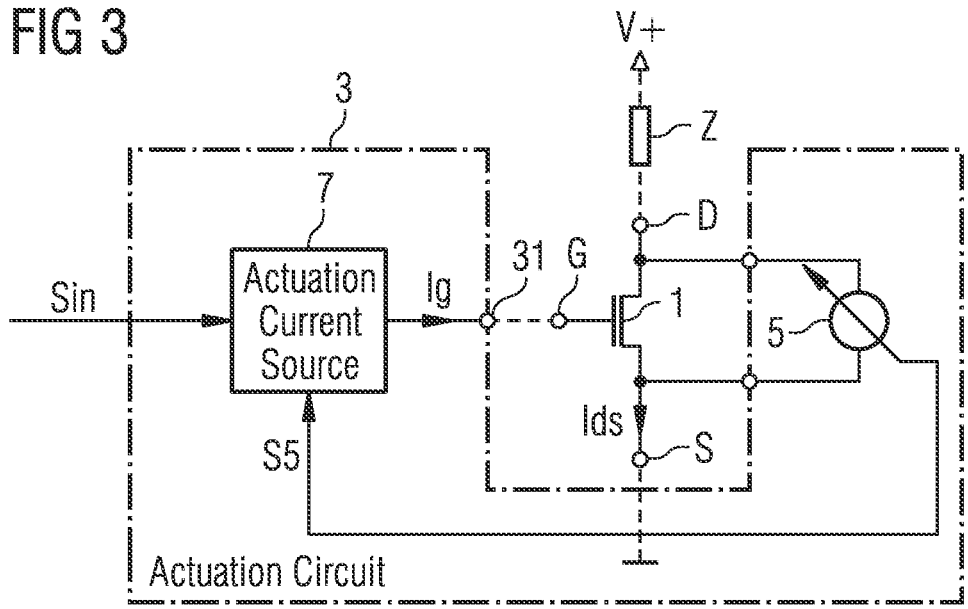

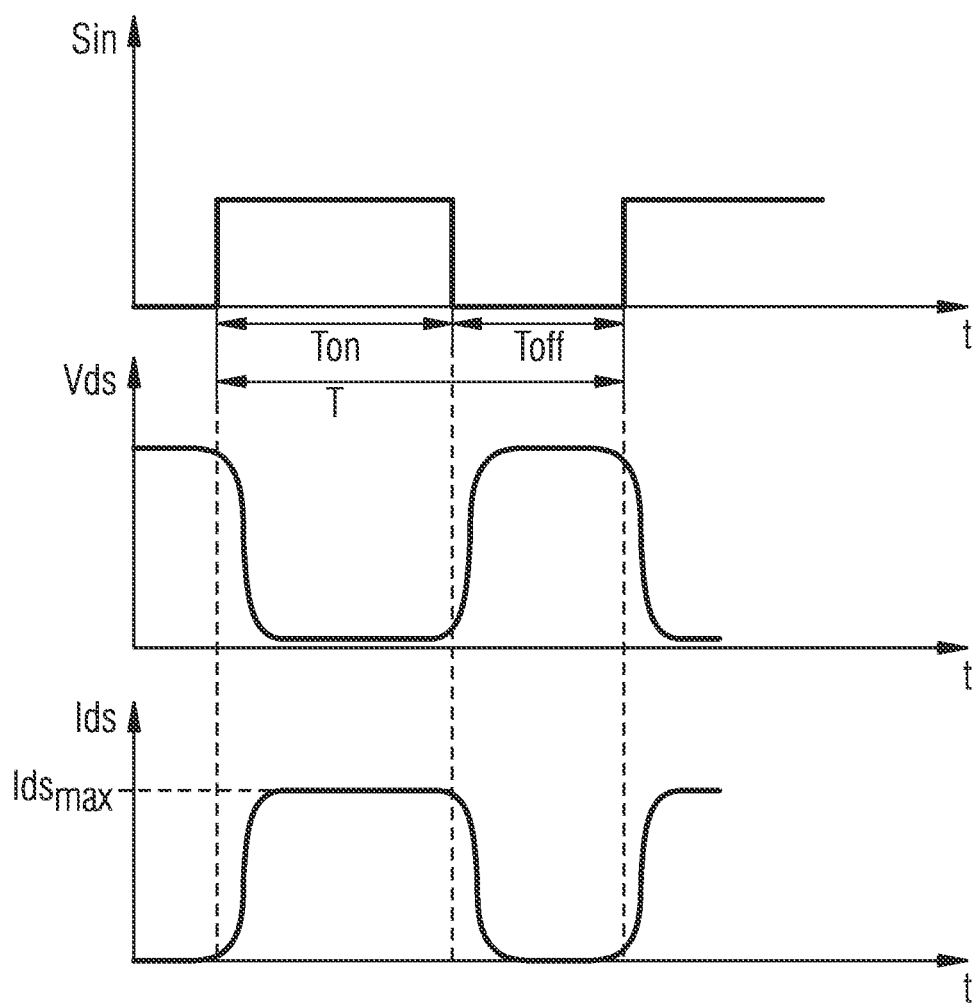

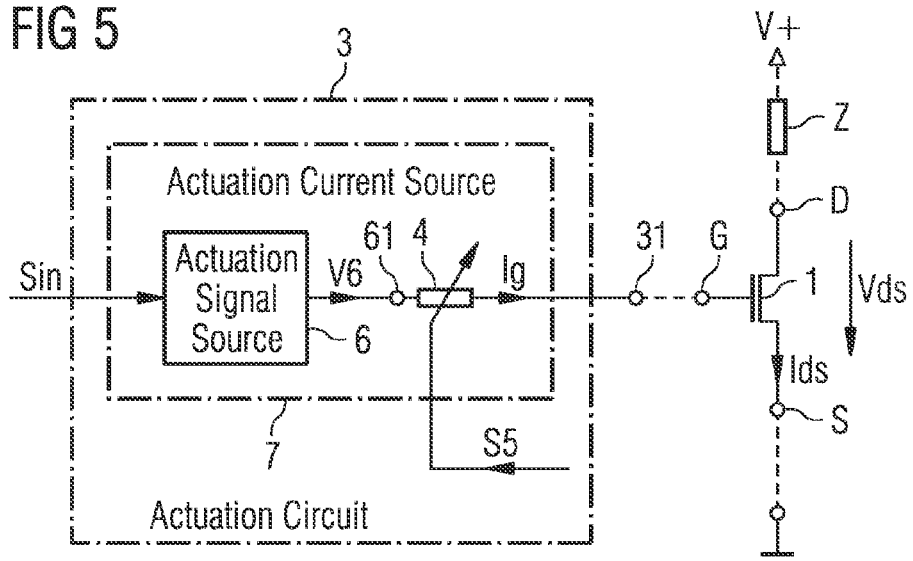
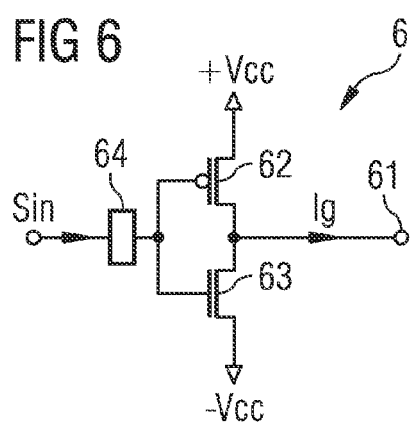
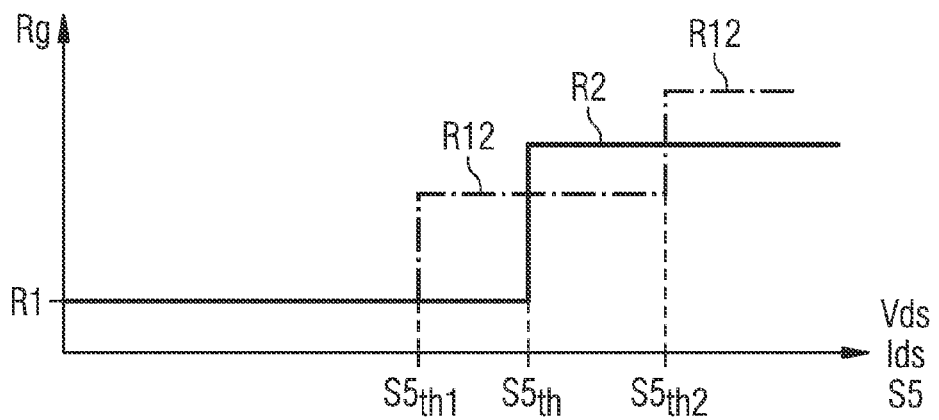

CIRCUIT FOR DRIVING A TRANSISTOR DEPENDENT ON A MEASUREMENT SIGNAL

CROSS-REFERENCE TO RELATED APPLICATIONS

This Utility Patent application is a continuation-in-part application of U.S. Pat. No. 8,299,820 Ser. No. 12/241,882, filed Sep. 30, 2008, which is incorporated herein by reference.

BACKGROUND

The switches used for switching electrical loads may be transistors, which have an actuation connection and a load path. In an application of this kind, the load path of the transistor is connected in series with the load between terminals for a supply voltage. The transistor is turned on to turn on the load or the transistor is turned off to turn off the load by using an actuation signal which is supplied to the actuation connection of the transistor.

When a transistor of this kind used as a switch is off, the load current flowing through the transistor is zero and the load path has a blocking voltage across it which is high in comparison with the load path voltage when the transistor is on. When the transistor is turned on, the load path voltage falls to a lower value and the load current rises. This load current is definitively dependent on the applied supply voltage and the load.

A critical factor for switching processes, i.e. when the transistor changes from the on state to the off state or when the transistor changes from the off state to the on state, may be steep voltage edges—i.e. large changes in the voltage over time—or steep current edges—i.e. large changes in the current over time. Thus, steep current edges may result, by way of example, in unwanted voltage spikes on parasitic inductances which are formed by supply lines, for example. Steep voltage edges interacting with parasitic resonant circuits may result in unwanted voltage spikes. By way of example, parasitic resonant circuits of this kind include inductances in supply lines and the capacitance of a printed circuit board on which the transistor and the load are mounted.

SUMMARY

One aspect relates to a circuit. The circuit includes an input configured to receive an input signal, an actuation output configured to be connected to an actuation terminal of a transistor, and a measurement circuit. The measurement circuit is configured to ascertain at least one of a load current through a load path of the transistor, and a load voltage across the load path of the transistor and to provide a measurement signal that is dependent on at least one of the load current and the load path voltage. An actuation current source is configured to receive the measurement signal and to provide an actuation current at the actuation output, the actuation current having a current level dependent on the measurement signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates one embodiment of an actuation circuit for the transistor.

FIG. 3 illustrates one embodiment of an actuation circuit (drive circuit) for the transistor.

FIG. 4 illustrates one embodiment of switching processes using signal waveforms.

FIG. 5 illustrates one embodiment of a circuit arrangement with a transistor and an actuation circuit for the transistor, which has a resistor arrangement with a variable resistor.

FIG. 6 illustrates one embodiment of an actuation signal source for the actuation circuit.

FIG. 7 illustrates the way in which an example of a resistor arrangement works using signal profiles.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
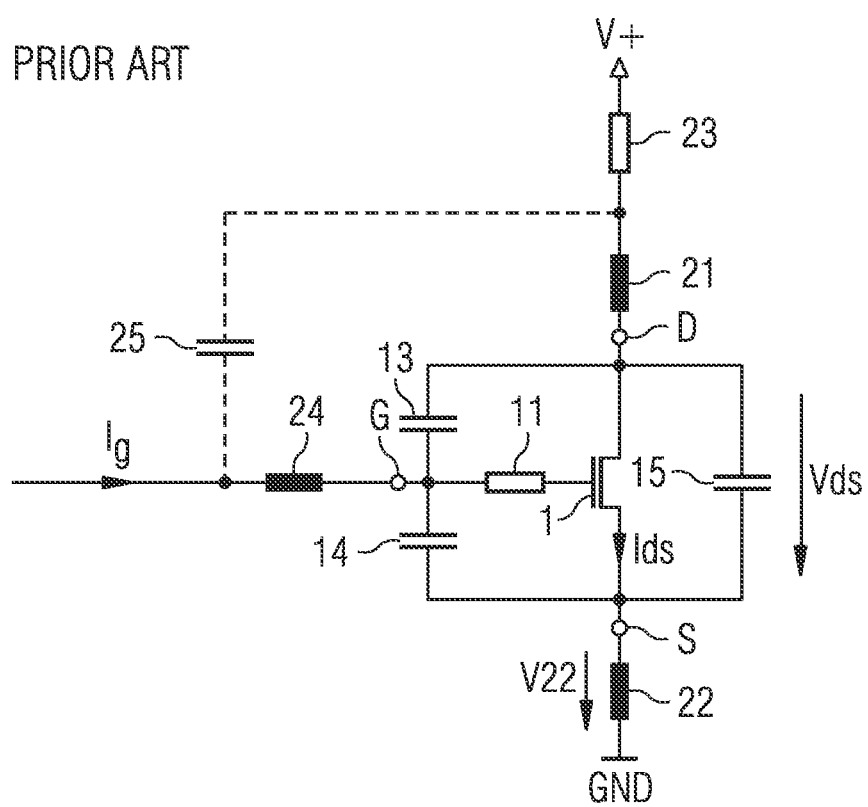
FIG. 1 illustrates the electrical equivalent circuit diagram for a transistor used as a switch.

FIG. 1 shows an electrical equivalent circuit diagram to illustrate the use of a transistor 1 as a switch for switching an electrical load 23. The transistor has an actuation connection (that may also be referred to as actuation terminal, or control terminal) G for supplying an actuation signal (control signal) and a load path D-S. If the transistor is used—as in the example illustrated—as an electronic switch for switching a load, its load path D-S is connected in series with the load 23 between supply voltage terminals between which a supply voltage is applied. A first of these supply voltage terminals is a terminal for a positive supply potential V+, for example, and a second of these supply voltage terminals is a terminal for a negative supply potential or reference-ground potential GND, for example.

The transistor 1 illustrated in FIG. 1 is in the form of a MOSFET (Metal Oxide Semiconductor Field-Effect Transistor) and has a gate connection (gate terminal) G, which forms the actuation connection, and also drain and source connections (drain and source terminals) D, S which have the load path D-S running between them. This MOSFET may be a MOSFET operating on the basis of the compensation principle, in one embodiment. It should be pointed out that the MOSFET illustrated in FIG. 1 can be considered only as an example, and it goes without saying that it is also possible to use any other transistor, particularly an IGBT (Insulated Gate Bipolar Transistor), a Junction FET (JFET), a bipolar junction transistor (BJT), a High Electron Mobility Transistor (HEMT), GaN-HEMT, SiC-JFET, SiC-MOSFET, instead of this MOSFET.

Besides the transistor 1 and the load 23, FIG. 1 also illustrates parasitic components which are inevitably present. The load is, e.g., a load having an ohmic, an inductive, and/or a capacitive characteristic. The circuit arrangement of FIG. 1 may be part of a power converter arrangement, such as boost converter, buck converter, flyback-converter, and the like. These parasitic components include internal parasitic components of the transistor 1: a gate/source capacitance 14 which is present between the gate connection G and the source connection S; a gate/drain capacitance 13 which is present between the gate connection G and the drain connection D, and which is also called a Miller capacitance; a drain/source capacitance 15 which is present between the drain connection D and the source connection S; and an internal gate resistance 11 which is present between the externally accessible gate connection G and a gate oxide (not illustrated) inside the MOSFET 1. If the MOSFET is a MOSFET operating on the basis of the compensation principle, the capacitance value of its output capacitance is dependent on the output voltage, as is known in principle, and falls nonlinearly as the output voltage increases.

In addition to the internal parasitic components, external parasitic components are present. In the example illustrated, these external parasitic components are supply line inductances 21, 22, 24, which are formed by supply lines to the drain connection D, the source connection S and the gate connection G, and also a parasitic capacitance 25 which is formed between the gate supply line and the drain supply line. This gate supply line and the drain supply line are conductor tracks on a printed circuit board, for example, this not being illustrated in more detail. The capacitance between these conductor tracks on the printed circuit board corresponds to the parasitic capacitance 25.

The MOSFET 1 starts to conduct when its gate/source capacitance 14 has been electrically charged to the extent that a gate/source voltage Vgs applied between gate and source G, S is greater than a threshold voltage of the MOSFET. The MOSFET is turned on and off by using an actuation circuit, which is not illustrated in more detail in FIG. 1 and which provides a gate current Ig as actuation signal for the MOSFET 1. In an n-channel MOSFET, this gate current is chosen such that it flows in the direction of current illustrated in FIG. 1 in order to charge the gate/source capacitance 14 and hence to turn on the MOSFET, and such that it flows in the opposite direction in order to discharge the gate/source capacitance 14, and hence to turn off the MOSFET 1.

When the MOSFET 1 is off, the load current Ids flowing through the MOSFET 1 is about zero and a load path voltage Vds across the load path D-S corresponds at least to the supply voltage. However, this load path voltage Vds may also be higher than the supply voltage on account of the parasitic inductances 21, 22, and particularly if the load is an inductive load. When the MOSFET 1 is on, the load current Ids is not equal to 0 and is essentially determined by the supply voltage and the type of load 23. The load path voltage Vds applied when the MOSFET 1 is on is dependent on the load current Ids flowing and on the turn-on resistance of the component. In the case of a power MOSFET with a breakdown voltage of up to a few 100 volts, this voltage drop is merely a few volts if the load current corresponds to the rated current of the component.

A critical factor for switching processes, that is to say when the MOSFET 1 changes from the on state to the off state, and vice versa, may be steep edges of the load current Ids or of the load path voltage Vds, that is to say large changes in the load current Ids or in the load path voltage Vds over time. In the text below, d(Ids)/dt denotes a change in the load current over time, and d(Vds)/dt denotes a change in the load path voltage Vds over time in the text below.

When the internal channel of the MOSFET 1 is turned off, the previously flowing load current Ids continues to flow at first and charges the output capacitance 15. This process is definitive for the change in the load path voltage Vds over time, for which the following applies:

$$\frac{d(Vds)}{dt} = \frac{Ids}{C14} \tag{1}$$

here, C14 denotes the capacitance value of the output capacitance 15. The change in the load path voltage over time is greater in this case the greater the load current Ids flowing before the MOSFET 1 was turned off and the smaller the output capacitance 15. If the area-specific turn-on resistance $R_{ON}\cdot A$, where $R_{ON}$ denotes the turn-on resistance and A denotes the chip area required to implement the component, is reduced, e.g. by utilizing the compensation principle (super junction principle), the chip areas of power transistors are reduced for the same turn-on resistance. This reduction in the chip areas also brings about a reduction in the output capacitances, which means that larger changes in the output voltage over time can occur for the same load currents.

The circuit arrangement illustrated in FIG. 1 contains a parasitic resonant circuit which is formed by the parasitic inductance 24 in the gate supply line, by the gate/drain capacitance 13, by the parasitic inductance 21 in the drain supply and by the parasitic capacitance 25 between the gate and drain supply lines. Energy is introduced into this parasitic resonant circuit when the output voltage Vds changes, the energy input being greater the greater the change in the output voltage Vds over time. This introduced energy excites the resonant circuit to produce oscillations whose frequencies may be in the region of a few 100 MHz and can cause voltage spikes on the gate connection G whose amplitude is greater the greater the energy introduced into the parasitic resonant circuit. Such voltage spikes are undesirable insofar as they can result in high voltage loads, and in the worst case may result in destruction of the gate oxide of the MOSFET 1. On account of the correlation explained above between the capacitance value of the output capacitance and the gradient of the voltage edge, this problem occurs more the smaller the output capacitance.

When the MOSFET 1 is turned off and when the load current Ids (after charging the drain/source capacitance 15) becomes 0, this change in the load current Ids results in an induced voltage in the parasitic inductance 22 in the source supply line. For this induced voltage V22, the following applies $$V22 = -L22 \cdot \frac{d(Ids)}{dt} \quad (2)$$

Here, L22 denotes the inductance value of this parasitic inductance. When this inductance value L22 is given, the induced voltage 22 is greater the greater the change in the load current Ids over time. If the load path voltage Ids becomes lower when the MOSFET 1 is turned off, the voltage V22 is a negative voltage in relation to the reference-ground potential GND. If the gate connection G of the MOSFET 1 is at reference-ground potential GND, for example, in order to turn off the MOSFET, the induced negative voltage V22 applied to the source connection S causes the gate/source junction of the MOSFET 1 to have an actuation voltage applied across it which corresponds to the induced voltage V22 and which initiates the MOSFET 1. This can result in an undesirable oscillatory response when the MOSFET 1 is turned off.

FIGS. 2 and 3 illustrate examples of an actuation circuit 3 for actuating a transistor 1. This transistor 1, which is likewise illustrated in FIGS. 2 and 3, is a MOSFET, for example, as has already been explained with reference to FIG. 1.

The actuation circuit 3 includes: an actuation output 31 for connection to the actuation connection G of the MOSFET 1, an actuation current source 7 for providing an actuation current Ig at the actuation output 31, and a measurement arrangement 5 for providing a measurement signal S5 which is supplied to the actuation current source 7. With reference to FIG. 2, the measurement arrangement 5 is a current measurement arrangement, for example, which is designed to produce a current measurement signal as measurement signal S5 which is dependent on a current flowing through the load path D-S of the transistor 1. With reference to FIG. 3, the measurement arrangement may also be a voltage measurement arrangement which is designed to produce a voltage measurement signal as measurement signal S5 which is dependent on a voltage across the load path D-S of the transistor 1.

In the case of the actuation circuit 3 illustrated in FIGS. 2 and 3, the MOSFET 1 is turned on or off as stipulated by an input signal Sin which is supplied to the actuation current source 7. By way of example, this input signal is a binary signal which can assume a turn-on level and a turn-off level. In this case, the actuation current source 7 is designed to provide the actuation output with an actuation current Ig which is dependent on the input signal Sin and which has a turn-on current level or a turn-off current level on the basis of the signal level of the input signal, for example. In this example the transistor 1 is turned on when the actuation current Ig is at its turn-on current level, and the transistor 1 is turned off in this example when the actuation current Ig is at its turn-off current level.

The type of actuation current is dependent on the type of transistor which is actuated by the actuation circuit 3. For the explanation which follows, it is assumed that this transistor is an n-channel MOSFET. To actuate a transistor of this kind, the actuation current source 7 delivers an actuation current at a turn-on current level when the input signal Sin is at the turn-on level, the actuation current flowing in the current direction illustrated in FIGS. 2 and 3. The gate/source capacitance (14 in FIG. 1) of the transistor 1 is charged as a result, so that the transistor 1 is turned on. An actuation current of this kind with a turn-on current level is subsequently also called a gate charging current. When the input signal Sin is at a turn-off level, the actuation current source 7 delivers an actuation current at a turn-off current level, which flows in the opposite direction to that illustrated in FIGS. 2 and 3 and which discharges the gate/source capacitance of the MOSFET, which turns off the MOSFET 1. Taking account of the direction of current illustrated in FIGS. 2 and 3 for the actuation current Ig, the turn-on current level is a positive current level and the turn-off current level is a negative current level.

For a given gate/source capacitance 14, the amplitude of the gate charging current or of the gate discharge current directly influences the switching speed of the actuated transistor 1, and hence the gradient of the switching edges. In this case, it applies generally that the switching speed—and hence the gradient of the switching edges—decreases as the amplitude of the gate charging current or gate discharge current decreases. In the case of this actuation circuit 3, the turn-on current level and the turn-off current level of the actuation current Ig can be used to set the switching speed of the transistor or the gradient of the switching edges directly.

FIG. 4 uses schematically illustrated waveforms for the input signal Sin, the load path voltage Vds and the load path current Ids to illustrate the actuation of a MOSFET 1 by using the actuation circuit 3 explained with reference to FIGS. 2 and 3. In the example illustrated, the MOSFET is actuated in clocked or pulse-width-modulated fashion, that is to say that during successive actuation periods the MOSFET is respectively turned on for a turned-on time, which is denoted by Ton in FIG. 4, and turned off for a turned-off time, denoted by Toff in FIG. 4, which follows the turned-on time Ton. In FIG. 4, the turned-on time Ton corresponds to the period of time during which the input signal Sin assumes a turn-on level (in the example a high level), and the turned-off time corresponds to the period of time during which the input signal Sin assumes a turn-off level (in the example a low level). A duration of an actuation period is denoted by T in FIG. 4.

Both the times T of successive actuation periods and the turned-on and turned-off times Ton, Toff during successive actuation periods may be different or vary.

In line with the previous explanations, the load path voltage Vds starts to fall at the start of the turned-on time Ton, that is to say when a gate charging current is flowing, until the MOSFET 1 is fully on and the load path voltage assumes its minimum value, and the load current Ids starts to rise. Conversely, the load path voltage Vds starts to rise when the input signal Sin assumes its turn-off level, so that a gate discharge current flows, and the load path voltage Ids begins to fall.

To be able to control the change d(Vds/dt) in the load path voltage Vds and d(Ids/dt) in the load current Ids over time, and particularly to be able to set its upper limit, the turn-on current level and the turn-off current level of the actuation current Ig can be set on the basis of the measurement signal S5. These turn-on and turn-off current levels are set such that the absolute value of the gate charging current and/or of the gate discharge current decreases as load currents increase or as load path voltages increase. For large load currents, this results in the switching processes slowing down, which limits the change in the load path voltage Vds or in the load current Ids over time during the switching processes. The turn-on and turn-off current levels can be set on the basis of at least one of the load current (as in FIG. 2) and the load path voltage. In this case, use is made of the fact that the load path voltage Vds is directly proportional to the load current Ids, using the turn-on resistance as proportionality factor, when the transistor 1 is fully on. According to one embodiment, the turn-on and turn-off current levels are set dependent on one of the load current and the load path voltage. According to a further embodiment, both the load current and the load path voltage are taken into account. In this case, a weighted signal based on the load current and the load path voltage is generated, and the turn-on and turn-off currents are generated based on the weighted signal.

The turn-on and turn-off current levels may have the same absolute values and may differ only in terms of arithmetic sign, but may also be produced such that they have different absolute values. In one embodiment, it is also possible to set only one of these current levels, e.g. the turn-on current level, on the basis of the measurement signal S5. These current levels can change continuously with the load current Ids or the load path voltage Vds or else in processes with the load current Ids or the load path voltage Vds. In one example, provision is made for the load current Ids or the load path voltage Vds during a turned-on time Ton to be ascertained and for the current levels for the next or for a few next actuation periods to be matched to the ascertained value for the load current Ids or the load path voltage Vds.

FIG. 5 illustrates an example of a possible implementation of the actuation current source 7. This actuation current source 7 has a resistor arrangement 4 and an actuation signal source 6. The resistor arrangement 4 is connected between the actuation signal source 6 and the actuation output 31 and has a non-reactive resistance value which is dependent on the measurement signal S5. To set this resistance value, the resistor arrangement 4 is supplied with the measurement signal S5 from the measurement arrangement 5 (not illustrated in FIG. 5).

The input signal Sin, which stipulates whether the transistor 1 is turned on or off, is supplied to the actuation signal source 6. This input signal Sin is—as already explained—a binary signal, for example, which can assume a turn-on level and a turn-off level. The actuation signal source 6 is designed to provide a signal source output 61 with an actuation signal which is dependent on the input signal Sin. When the input signal Sin is at a turn-on level, the actuation signal source 6 uses the resistor arrangement 4 to deliver an actuation signal to the actuation output 31, the actuation signal being suitable for turning on a transistor 1 which can be connected to the actuation output 31. In this case, the type of actuation signal is dependent on the type of transistor which is actuated by the actuation circuit 3. For the explanation which follows, it will be assumed that this transistor is an n-channel MOSFET.

To actuate an n-channel MOSFET of this kind, the actuation signal source 6 delivers a positive actuation voltage V6 relative to the source connection S of the MOSFET 1 when the input signal Sin is at a turn-on level, the positive actuation voltage V6 resulting, across the resistor arrangement 4, in an actuation current Ig or gate charging current which flows to the actuation output 31 in the direction illustrated and which charges the gate/source capacitance (14 in FIG. 1), so that the MOSFET 1 is turned on. When the input signal Sin is at a turn-off level, the actuation signal source 6 delivers a negative voltage relative to the source connection S of the MOSFET 1 or a voltage of zero relative to the source connection S of the MOSFET 1, the voltage resulting, across the resistor arrangement 4, in an actuation current Ig or gate discharge current which flows in the opposite direction to the one illustrated and which discharges the gate/source capacitance of the MOSFET 1, which turns off the MOSFET 1.

By way of example, the actuation signal source 6 is in the form such that it produces the actuation voltage V6 only on the basis of the input signal Sin. In this case, the actuation current Ig is directly dependant on the resistance value of the resistor arrangement 4 and is smaller the greater this resistance value. Since the amplitudes of the gate charging current and the gate discharge current—i.e. the turn-on current level and the turn-off current level, for a given gate/source capacitance 14—have a direct influence on the switching speed of the actuated transistor 1, and hence on the gradient of the switching edges, it is possible for the switching speed or the gradient of the switching edges in the actuation circuit 3 illustrated to be set using the resistor arrangement.

An example of an actuation signal source 6 which provides the actuation voltage V6 is illustrated in FIG. 6. This actuation signal source 6 has an inverter with two complementary transistors 62, 63 which are connected between terminals for a positive and a negative actuation potential +Vcc, −Vcc. In this embodiment, the positive and negative actuation potentials are respectively actuation potentials which are referenced to the electrical potential on one of the load path connections of the transistor—in the case of a MOSFET, the electrical potential on the source connection S. Instead of the negative actuation potential—Vcc, the lower actuation potential could also be zero, i.e. could correspond to the electrical potential on the load path connection. The two complementary transistors 61, 62 are respectively actuated by the input signal Sin via an inverter 64. In the example illustrated, the upper of the two transistors in the inverter is a p-channel transistor and the lower is an n-channel transistor. When the upper 62 of the two transistors is on and the lower 63 is off, the signal source output 61 is at the positive actuation potential Vcc. When a MOSFET 1 is connected, a gate charging current flows in this case in the direction illustrated in FIG. 6, the current value of the charging current being definitively dependent on the resistance value of the resistor arrangement 4. When the lower 63 of the two transistors is on and the upper 62 is off, the signal source output 61 is at the negative actuation potential −Vcc or zero, and when a MOSFET 1 is connected a discharge current flows in the opposite direction to the one illustrated in FIG. 6, the current value of the discharge current being definitively dependent on the resistance value of the resistor arrangement 4.

In the embodiment of the actuation signal source 6 illustrated in FIG. 6, the upper transistor 62 is on and the lower transistor 63 is off when the input signal Sin assumes a high level. Conversely, the lower transistor 63 is on and the upper transistor 62 is off when the input signal Sin assumes a low level. In the case of this actuation signal source 6, a high level of the input signal Sin corresponds to a turn-on level and a low level of the input signal Sin corresponds to a turn-off level.

In the embodiment of the actuation circuit illustrated in FIG. 5, the resistance value of the resistor arrangement 4 can be set on the basis of the measurement signal, i.e. on the basis of the load current Ids or the load path voltage Vds. In one example, provision is made for this non-reactive resistance to be able to assume at least two different resistance values: a first resistance value; and a second resistance value, which is larger than the first resistance value. In this case, the resistor arrangement 4 is designed to assume the larger second resistance value for load current values which are larger than a prescribed load current threshold value or load path voltage threshold value and to assume the smaller first resistance value for load current values which are smaller than the prescribed load current threshold value or load path voltage threshold value. The increase in the resistance value of the resistor arrangement 4 for large load current values or load path voltage values, that is to say for load current values or load path voltage values which are larger than the load current threshold value or load path voltage threshold value, for example, results in a reduction in the gate charging and discharge current and hence in the switching processes slowing down. In this way, the change in the load path voltage Vds or the load current Ids over time is limited during the switching processes.

An example of a dependency of the resistance value of the resistor arrangement 4 on the measurement signal S5 is illustrated in FIG. 7. Rg denotes the resistance value of the resistor arrangement 4 in FIG. 7. In the example illustrated, this resistance value Rg corresponds to a first resistance value R1 for measurement signal values S5 which are smaller than a threshold value $S5_{th}$, and to a second resistance value R2 for measurement signal values S5 which are larger than the threshold value $S5_{th}$. In this embodiment, the measurement signal threshold value corresponds directly to a load current threshold value or to a load path voltage threshold value.

It is possible to implement the resistor arrangement 4 such that it is able to assume more than two different resistance values. A curve illustrated in dot-dashes in the FIG. 7 illustrates the profile of the resistance value Rg for such an example. In this case, the resistor arrangement 4 can assume three different resistance values on the basis of the load current Ids: a first resistance value R1 for measurement signal values which are lower than a first threshold value $S5_{th1}$; a second resistance value R12 for measurement signal values between a first and a second threshold value $S5_{th1}$, $S5_{th}$, and a third resistance value R12 for measurement signal values higher than the second threshold value $S5_{sth2}$. The provision of three different resistance values can merely be regarded as an example. It goes without saying that the number of different resistance values which the resistor arrangement 4 can assume can be chosen as desired.

The change in the load path voltage Vds and the load current Ids over time during the switching processes is dependent on the maximum load current ($Ids_{max}$ in FIG. 4) or a maximum load path voltage which occurs during a turned-on time Ton. In one example, provision is made for the resistance value of the resistor arrangement 4 to be set to be directly dependent on the maximum value of the load current or the load path voltage which occurs during this actuation period.

Figure 8:
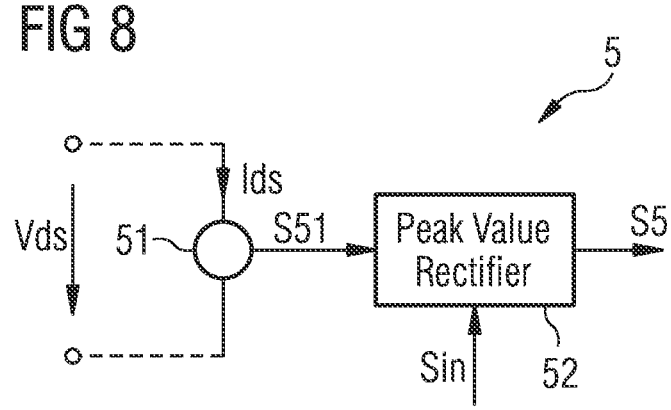
FIG. 8 illustrates one embodiment of a current measurement arrangement in the actuation circuit.

An example of a measurement arrangement 5 which can be used to achieve such operation is illustrated in FIG. 8. This measurement arrangement 5 has a measurement unit 51 which is implemented either as a current measurement arrangement or as a voltage measurement arrangement and which is designed to sense the load current Ids of the transistor (not illustrated in FIG. 8) or the load path voltage thereof and to produce a first measurement signal S51 which is proportional to the load current Ids or the load path voltage Vds, for example. This first measurement signal S51 is supplied to a peak value rectifier 52 whose output provides the measurement signal S5. The peak value rectifier 52 can be reset and its output delivers the maximum value of the first measurement signal S51 which has occurred since the last reset as measurement signal S5. The peak value rectifier 52 is reset by the input signal Sin, for example, whenever a new actuation period starts, that is to say when the input signal Sin changes from a turn-off level to a turn-on level.

When the measurement arrangement 5 illustrated in FIG. 8 is used, the correct resistance value of the resistor arrangement 4, or generally the correct actuation current, first appears in the course of the turned-on time Ton, namely within the period of time within which the load current Ids rises to its maximum value. During the turn-off process, the resistance value associated with the maximum load current is then set and ensures that the changes in the load path voltage Vds and in the load current Ids over time are limited, as desired. It should be pointed out that the first measurement signal S51 in this arrangement is directly a measure of the load current Ids or the load path voltage Vds.

In another example, provision is made for the maximum load current Ids or the maximum load path voltage Vds during an actuation period to be ascertained and for this maximum value to be used during at least one subsequent actuation period to set the resistance value, or generally the actuation current. In this embodiment, the resistance value can be reset from actuation period to actuation period, in each case on the basis of the maximum load current voltage value or load path voltage value ascertained during the preceding actuation period. Furthermore, it is possible to ascertain the maximum load current or the maximum load path voltage only during every n-th—when n>1—actuation period and to use the maximum value ascertained in this manner to set the resistance value or the actuation current during the subsequent n-1 actuation periods.

Figure 9:
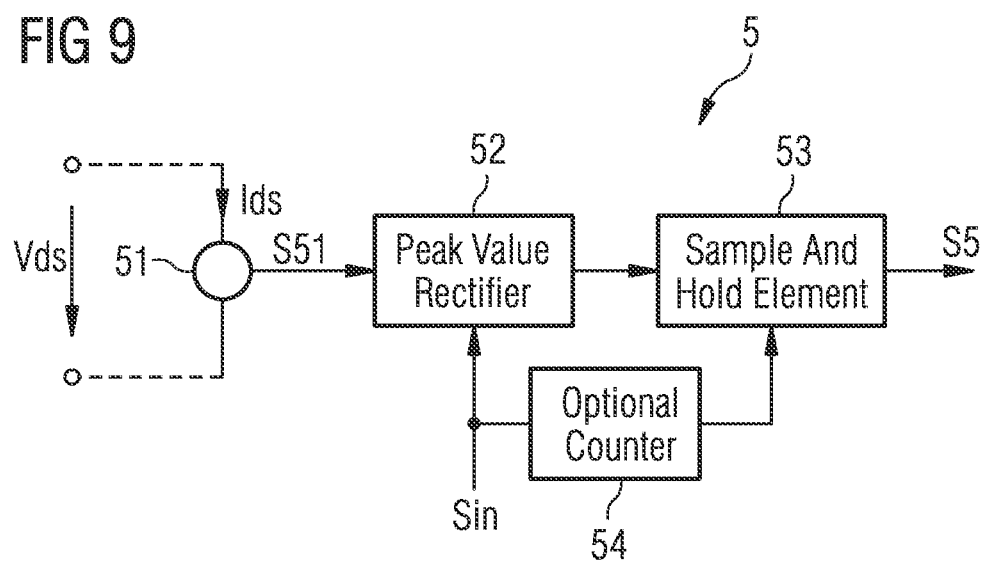
FIG. 9 illustrates one embodiment of a current measurement arrangement in the actuation circuit.

FIG. 9 illustrates an example of a measurement arrangement 5 which is suitable for implementing such a mode of operation. This measurement arrangement 5 differs from the one illustrated in FIG. 6 in that the peak value rectifier 52 has a downstream sample and hold element 53 which is supplied with the output signal from the peak value rectifier 52 and whose output provides the current measurement signal S5. The sample and hold element 53 samples the output signal from the peak value rectifier 52 as stipulated by the input signal Sin, for example, in each case at the start of an actuation period. As the measurement signal S5 during a present actuation period, the maximum value of the load current Ids or of the load path voltage is then available during the preceding actuation period. Actuation of the measurement signal S5 only during every n-th actuation period can be achieved by virtue of the sample and hold element 53 being actuated such that it samples the output signal from the peak value rectifier 52 only every n actuation periods. In this case, the sample and hold element 53 is actuated using the input signal Sin by an optional counter 54 which counts level changes in the input signal Sin and which actuates the sample and hold element 53 after n prescribed edge changes, that is to say n edge changes from a turn-off level to a turn-on level, for example, have occurred.

Figure 10:
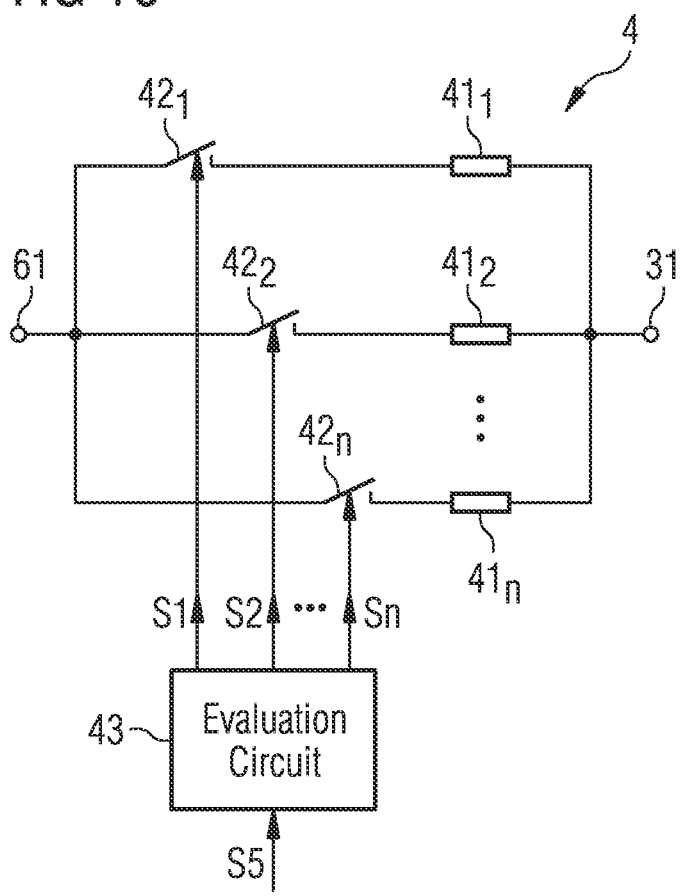
FIG. 10 illustrates one embodiment of a resistor arrangement.

An example of a resistor arrangement 4 which is designed to assume a plurality of different resistance values on the basis of the current measurement signal S5 is illustrated in FIG. 10. this resistor arrangement 4 includes at least two—in the example three—series circuits which each have a non-reactive resistance $41_1$, $41_2$, $41_n$ and a switching element $42_1$, $42_2$, $42_n$ which are connected in parallel with one another and in each case between the output 61 of the actuation signal source and the actuation output 31. To actuate the switching elements $42_1$, $42_2$, $42_n$, an evaluation circuit 43 is provided which is supplied with the current measurement signal S5 and which turns the individual switching elements on or off using actuation signals S1, S2, Sn on the basis of this current measurement signal S5. In one example, provision is made for the individual non-reactive resistances $41_1$, $41_2$, $41_n$ each to have a different non-reactive resistance value and for the evaluation circuit 43 to turn on only a respective one of the switching elements and to turn off the other switching elements on the basis of the measurement signal S5. In this embodiment, the non-reactive resistance values correspond to the non-reactive resistance values R1, R11, R12 illustrated in FIG. 7, for example. The evaluation circuit 43 in this case is designed to compare the measurement signal S5 with threshold values $S5_{th1}$, $S5_{th}$, $S5_{th2}$ which correspond to load current threshold values or load path voltage threshold values, and to turn on one of the switching elements on the basis of the comparison result in order to achieve the dependency of the non-reactive resistance value on the load current Ids/the load path voltage Vds or the current measurement signal S5 which is explained with reference to FIG. 7. It goes without saying that it is possible for more than three series circuits each containing a resistor element and a switching element to be provided in order to achieve a finer resolution, that is to say in order to obtain smaller load current ranges or load path voltage ranges which have a respective associated resistance value.

In another embodiment, provision is made for the individual non-reactive resistances $41_1$, $41_2$, $41_n$ each to have the same non-reactive resistance values and for the evaluation circuit 43 to be designed to vary the number of switching elements turned on on the basis of the current measurement signal S5. This varies the number of parallel-connected resistor elements, and hence the non-reactive resistance value which is effected between the output terminal 61 of the actuation signal source and the actuation output 31.

It is also possible to combine the two aforementioned variants, that is to say to provide non-reactive resistances having different non-reactive resistance values, and nevertheless to implement the evaluation circuit 43 such that it can turn on one, two or more switching elements simultaneously on the basis of a current measurement signal S5. In all variants, the evaluation circuit 43 and the series circuits are in tune with one another such that the resistance which is effective between the signal source output 61 and the actuation output 31 is higher the larger the load current represented by the current measurement signal.

Figure 11:
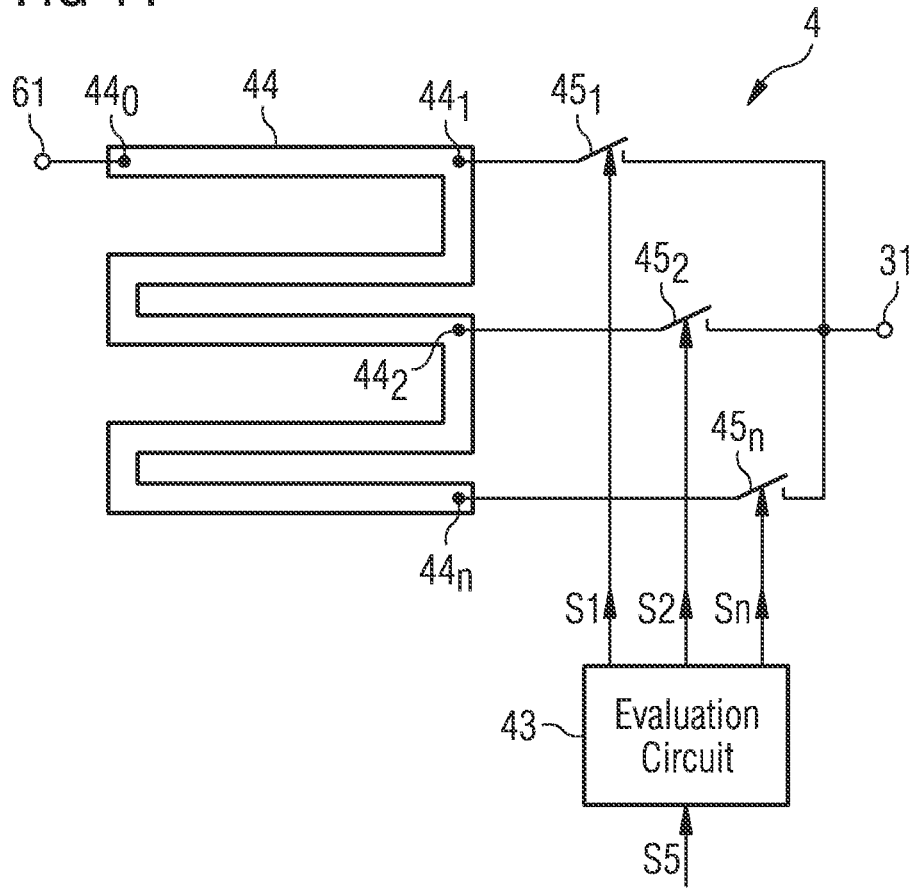
FIG. 11 illustrates one embodiment of a resistor arrangement.

FIG. 11 illustrates another embodiment of a resistor arrangement 4 which can set a plurality of different discrete resistance values between the output 61 of the actuation signal source and the actuation output 31 on the basis of the measurement signal S5. This resistor arrangement 4 includes a resistive conductor track 44 with an input tap $44_0$, which is connected to the signal source output 61, and with a plurality of—in the example three—output taps $44_1$, $44_2$, $44_n$ which are arranged at a distance from one another and each of which is connected to the actuation output 31 via a respective switching element $45_1$, $45_2$, $45_n$. To actuate these switching elements $45_1$, $45_2$, $45_n$, an evaluation circuit 43 is provided which is supplied with the measurement signal S5 and which is designed to turn on a respective one of the switching elements $45_1$, $45_2$, $45_n$ on the basis of the measurement signal S5 using actuation signals S1, S2, Sn. In this embodiment, the way in which the evaluation circuit 43 works corresponds to the way in which the evaluation circuit explained previously with reference to FIG. 10, based on the first variant, works. When one of the switching elements $45_1$, $45_2$, $45_n$ is on, the non-reactive resistance which is effected between the signal source output 61 and the actuation output 31 thus corresponds to the non-reactive resistance possessed by the conductor track 44 between the input tap $44_0$ and that output section whose associated switching element is on. In this embodiment, the non-reactive resistance value is higher the further away the output tap whose associated switching element is on from the input tap $44_0$.

Figure 12:
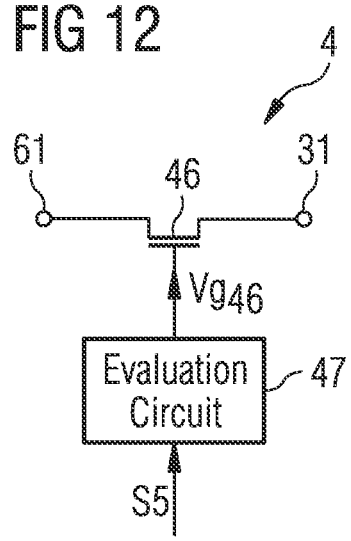
FIG. 12 illustrates one embodiment of a resistor arrangement which has a transistor as resistor element.

In another example, provision is made for the resistance value of the resistor arrangement 4 to be varied continuously on the basis of the measurement signal 5. An example of such a resistor arrangement is illustrated in FIG. 12. This resistor arrangement 4 has a controllable resistor element 46 which has a resistance path, connected between the signal source output 61 and the actuation output 31, and a setting connection. This resistor element is a transistor in the example illustrated, particularly a MOSFET, whose load path or drain/source path forms the resistance path and whose control connection or gate connection forms the setting connection. This transistor serving as a resistor element is actuated by an evaluation circuit 47 which is supplied with the measurement signal S5 and which provides an actuation signal $Vg_{46}$ which is dependent on the measurement signal. The association of the current measurement signal S5 with different signal values of the setting signal $Vg_{46}$ by the evaluation circuit 47 is effected by a calculation unit, for example, or by using a look-up table which associates a respective value of the setting signal $Vg_{46}$ with the individual possible values of the measurement signal S5.

Figure 13:
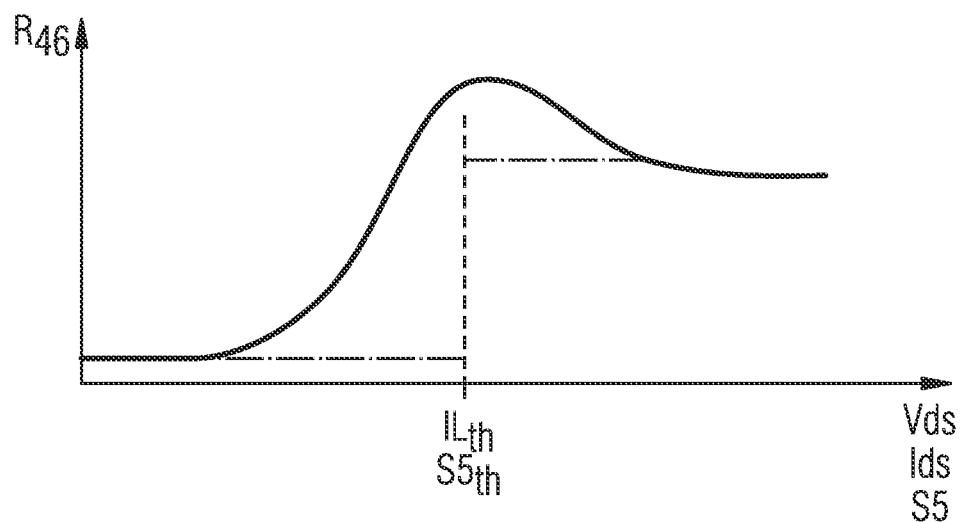
FIG. 13 illustrates the way in which the resistor arrangement illustrated in FIG. 10 works using a signal profile.

FIG. 13 illustrates the dependency of a non-reactive resistance $R_{46}$ in the resistance path on the measurement signal S5 for one example. In the example illustrated, for a prescribed threshold value $S5_{th}$, the resistor $R_{46}$ has a maximum value to which it rises on the basis of smaller measurement signal values and from which it falls again for increasing current measurement signal values. The resistor $R_{46}$ for measurement signal values which are higher than the threshold value $S5_{th}$ is higher than the resistance value $R_{46}$ for very small measurement signal values in this case, however.

Figure 14:
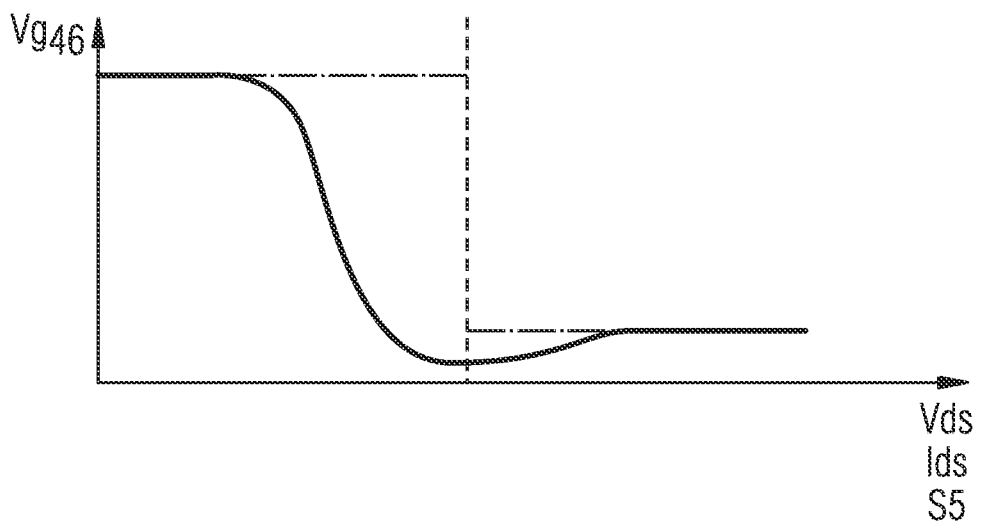
FIG. 14 illustrates one embodiment of a method for actuating the resistor element of the resistor arrangement illustrated in FIG. 10.

FIG. 14 illustrates the dependency of the setting values $Vg_{46}$ on the measurement signal S5 for the case of an n-channel MOSFET as resistor element. For the current measurement signal values S5 for which the resistance value $R_{46}$ assumes its maximum value, the setting signal is at its minimum value, and vice versa.

In general, it is true for all of the previously explained resistor arrangements that there is at least one value range for the load current or the load path voltage for which the resistance value of the resistor arrangement increases either continuously or in processes as the load current increases or as the load path voltage increases and for which the actuation current decreases either continuously or in processes as the load current increases or as the load path voltage increases. The resistance value or actuation current can in this case increase or decrease monotonously for the entire range of possible load current values or load path voltage values, as has been explained with reference to FIG. 7. The resistance value/the load current can also increase/decrease monotonously just for a sub-range of possible load current values and load path voltage values and can decrease/increase again for another sub-range, as has been explained with reference to FIG. 13.

The evaluation circuits in the previously explained resistor arrangements may be part of an integrated circuit which may contain the actuation current source 7 and also the measurement arrangement. In this case, the transistor 46 in the resistor arrangement 4 explained with reference to FIG. 12, may likewise be part of an integrated circuit of this kind.

As a measurement unit for the previously explained measurement arrangements 5, any current measurement units which are suitable for sensing the load current of a transistor and providing a first current measurement signal which is proportional to this load current are suitable. By way of example, such measurement units include a measurement resistor which is connected in series with the load path of the transistor during operation. However, such measurement units can also operate on the basis of what is known as the current-sensing principle and may include a transistor which is connected in parallel with the transistor whose load current is to be sensed and which is operated at the same operating point as the transistor which is to be measured. In this case, a current flowing through the measurement transistor is directly proportional to the current which flows through the transistor which is to be measured. The proportionality factor is in this case based on an area ratio between the measurement transistor and the transistor which is to be measured. Such current measurement units are known in principle, which means that further explanations in this regard can be dispensed with. Furthermore, suitable measurement units are any voltage measurement units which are suitable for sensing a voltage across the load path directly or indirectly. The load path voltage can be measured in this way by measuring the voltage across the load, the load path voltage being related to the voltage across the load taking into account a supply voltage across the series circuit including the transistor 1 and the load Z.

Figure 15:
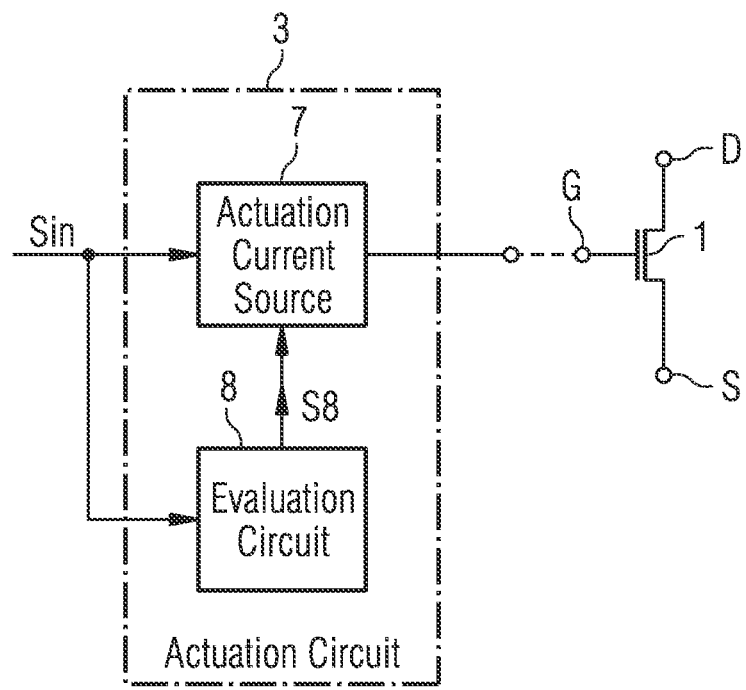
FIG. 15 illustrates one embodiment of an actuation circuit.

In the circuit arrangements explained above, the actuation current Ig is set on the basis of a load current flowing through the transistor or on the basis of a load path voltage across the load path of the transistor 1. In another example of an actuation circuit 3, which is illustrated in FIG. 15, provision is made for the actuation current Ig to be set on the basis of a duty cycle D of the pulse-width-modulated input signal Sin which stipulates whether the transistor 1 is intended to be on and off. With reference to FIG. 4, the duty cycle is based on a ratio between the turned-on time Ton and the total duration T of an actuation period, that is to say that the following is true: D=Ton/T The actuation circuit 3 illustrated has an actuation current source 7, which can be produced in line with one of the previously explained actuation current sources and which is supplied with a duty cycle signal S8 instead of with the previously explained measurement signal S5 for the load current or the load path voltage. The actuation current source 7 is designed to set the current level of the actuation current Ig on the basis of the duty cycle signal S8 such that the current level of the actuation current Ig becomes smaller as the duty cycle becomes larger. In line with the statements made above, the actuation current source may be in a form such that the current level of the actuation current decreases either continuously or in processes as the duty cycle increases.

This actuation circuit as illustrated in FIG. 15 is particularly suitable for actuating transistors which are used for switching inductive loads. For example, these are transistors in switch-mode converters, such as step-up or step-down converters, and particularly in step-up converters which are operated as power factor correction circuits (power factor controllers). When such inductive layers are switched, the duty cycle of the turn-on signal is a direct measure of the maximum value of the current which flows through the transistor 1 during the turned-on time Ton, this current increasing as the duty cycle increases.

The input signal Sin is produced by a control circuit which is not illustrated in more detail. The duty cycle signal, which represents the duty cycle, can be produced directly by this control circuit. If this signal is not available directly, then with reference to FIG. 8 it is also possible to produce the duty cycle signal S8 by evaluating the input signal Sin. In FIG. 15, the reference symbol 8 denotes an evaluation circuit for evaluating the input signal Sin and providing the duty cycle signal.

In line with the previous statements, the actuation current Ig can be adapted at the beginning of each duty cycle based on the duty cycle in the preceding actuation periode. According to a further embodiment, the duty cycle in one actuation period is determined, the drive current level is calculated based on the duty cycle, and the same actuation current level is used in a plurality of n, with n>2, actuation periods until the duty cycle is again evaluated. In this case, the duty cycle is only evaluated every n actuation periods.

Figure 16:
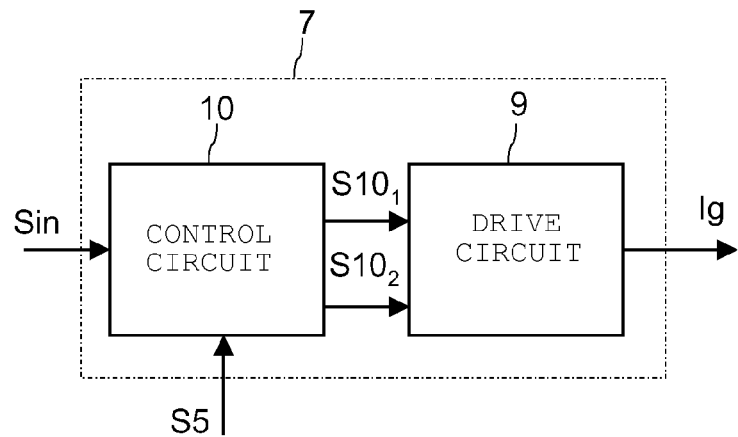
FIG. 16 illustrates one embodiment of a drive circuit that includes a control circuit and a drive circuit.

FIG. 16 illustrates a further embodiment of an actuation current source 7 that is configured to generate an actuation current (drive current) Ig dependent on an input signal Sin and a measurement signal S5. Like in the embodiments explained before, the measurement signal S5 represents one of a current (Ids in FIGS. 2 and 3) through a load path (D-S in FIGS. 2 and 3) of a transistor (1 in FIGS. 2 and 3), and a voltage across the load path of the transistor. The input signal Sin defines a desired switching state of the transistor. That is, the input signal Sin indicates if it is desired to switch on or to switch off the transistor.

Referring to FIG. 16, the actuation current source 7 includes a control circuit 10 that receives the measurement signal S5 and the input signal Sin, and a drive circuit 9. The drive circuit 9 generates the actuation current Ig dependent on at least one control signal $S10_1$, $S10_2$ received from the control circuit 10. The at least one control signal $S10_1$, $S10_2$ provided by the control circuit 10 includes information on the desired actuation current level and the desired actuation current flow direction. That is, the at least one control signal $S10_1$, $S10_2$ indicates if the transistor is to be switched on or is to be switched off and indicates the actuation current level of the actuation current Ig involved in the switching process. In the embodiment of FIG. 16, the control circuit 10 provides two control signals, namely a first control signal $S10_1$ indicating the actuation current flow direction, and a second control signal $S10_2$ indicating the actuation current level. However, providing two control signals is only an example. According to a further embodiment, only one control signal that includes an information on the desired action current flow direction and an information on the desired action current flow level is used. According to one embodiment, this control signal may have a positive signal level or a negative signal level, where one of the positive signal level and the negative signal level indicates a first actuation current flow direction, while the other one of the positive and the negative signal level indicates a second current flow direction. A magnitude of the positive and the negative signal levels indicates the actuation current level. In the embodiment of FIG. 16, the first control signal $S10_1$ is dependent on the input signal Sin, and the second control signal $S10_2$ is dependent on the measurement signal S5.

Figure 17:
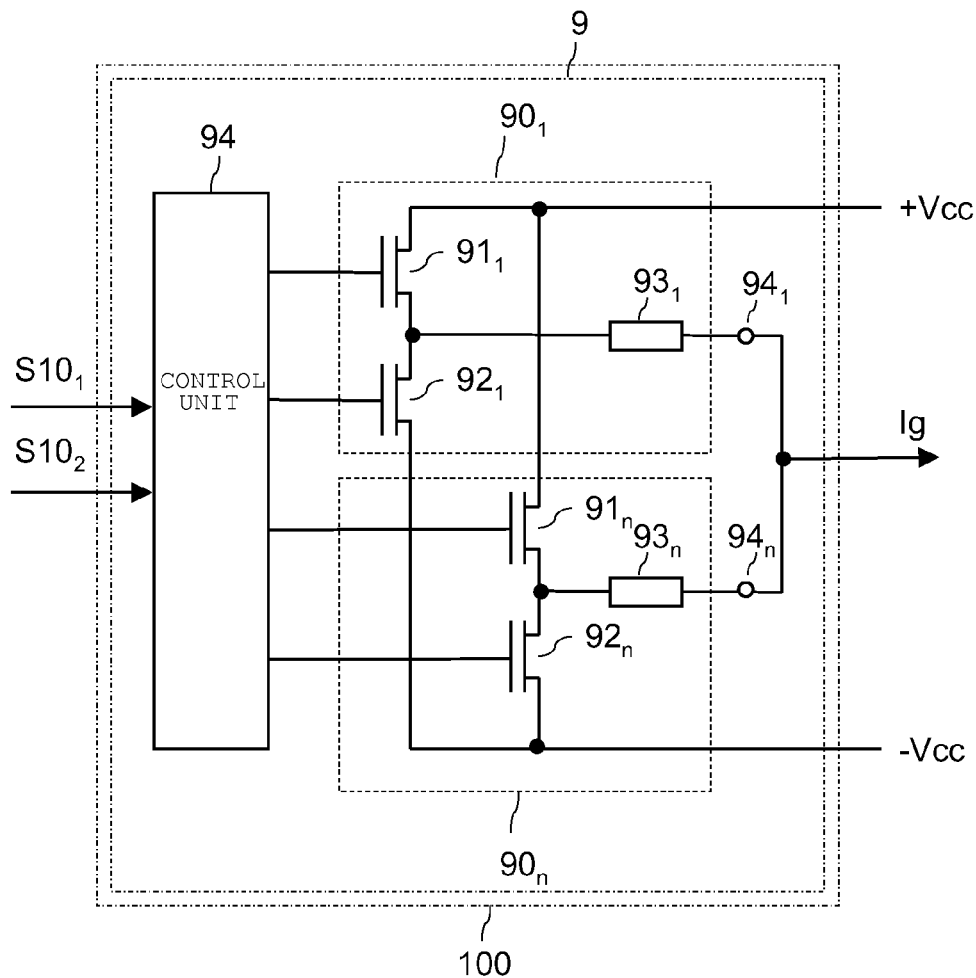
FIG. 17 illustrates a first embodiment of the drive circuit of FIG. 16.

FIG. 17 illustrates a first embodiment of the drive circuit 9. The drive circuit 9 includes a control unit 94 that receives the at least one control signal $S10_1$, $S10_2$, and at least two driver stages $90_1$, $90_n$. In FIG. 17, only two (n=2) driver stages are illustrated. However, the drive circuit 9 may be implemented with any plurality of driver stages other than n=2 as well.

Each driver stage $90_1$, $90_n$ includes at least one switching element connected between a terminal for one of a positive and a negative actuation potential +Vcc, −Vcc and an output $94_1$, $94_n$ of the driver stage $90_1$, $90_n$. In the embodiment of FIG. 17, each driver stage $90_1$, $90_n$ includes a half-bridge with a first switching element $91_1$, $91_n$ connected between the terminal for the positive supply potential +Vcc and the output $94_1$, $94_n$, and a second switching element $92_1$, $92_n$ connected between the terminal for the negative supply potential −Vcc and the output $94_1$, $94_n$. A resistive element $93_1$, $93_n$ is connected between the switching elements of each driver stage $90_1$, $90_n$ and the corresponding output $94_1$, $94_n$. The switching elements $91_1$, $91_n$, $92_1$, $92_n$ are implemented as transistors in the embodiment of FIG. 17, in particular as MOSFETs. However, any other type of transistor instead of a MOSFET may be used as the switching element as well.

The driver stages $90_1$, $90_n$ are each controlled by the control unit 94 dependent on the at least one control signal $S10_1$, $S10_2$. In the drive circuit 9 of FIG. 17, each driver stage $90_1$, $90_n$ may provide a drive current. The drive currents provided by the driver stages $90_1$, $90_n$ are added at the output of the drive circuit 9 where the outputs $94_1$, $94_n$ of the individual driver stages are connected. Thus, the actuation current Ig is the sum of the drive currents provided by the individual driver stages $90_1$, $90_n$. In the drive circuit 9 of FIG. 17, each driver stage $90_1$, $90_n$ may provide a drive current with a first current direction when the first switching element $91_1$, $91_n$ is switched on and when the second switching element $92_1$, $92_n$ is switched off, or may provide a drive current with a second current flow direction when the second switching element $92_1$, $92_n$ is switched on and when the switching element $91_1$, $91_n$ is switched off.

According to one embodiment, the resistive elements $93_1$, $93_n$ have different electrical resistances. In this case, six different actuation currents can be provided, namely three different actuation currents for switching on the transistor and three different actuation currents for switching off the transistor. For switching on the transistor 1, a first actuation current is provided when only the first transistor $91_1$ of the first driver stage $90_1$ is switched on, a second actuation current is provided when only the first switching element $91_n$ of the second driver stage $90_n$ is switched on, and a third actuation current is provided when both of the first switching elements $91_1$, $91_n$ of the first and second driver stages $91_1$, $90_n$ are switched on. For switching off the transistor, a fourth actuation current is provided when only the second switching element $92_1$ of the first driver stage $90_1$ is switched on, a fifth actuation current is provided when only the second switching element $92_n$ of the second driver stage $90_n$ is switched on, and a sixth actuation current is provided when both of the second switching elements $92_1$, $92_n$ of the first and second driver stages $90_1$, $90_n$ is switched on. Of course, the number of different current levels that can be provided increases as the number of driver stages increases.

The magnitude of the actuation current Ig is dependent on the resistances of the resistive elements $93_1$, $93_n$. According to one embodiment, the control circuit 10 and the control unit 94 are configured such that the driver stages $90_1$, $90_n$ are activated in such a way that the magnitude of the actuation current Ig increases as the load current or the load voltage represented by the measurement signal S5 increases. Due to the nature of the driver stages $90_1$, $90_n$ of FIG. 17, the actuation current Ig can be varied in discrete steps dependent on the measurement signal S5 by suitably activating at least one of the driver stages $90_1$, $90_n$.

The drive circuit 9 may be implemented as integrated circuit. The resistive elements may be integrated $93_1$, $93_n$ in the same semiconductor body as the transistors of the driver stages $90_1$, $90_2$ and the control unit. In FIG. 17, the dashed and dotted line labeled with reference character 100 illustrates the components integrated in the semiconductor body.

Figure 18:
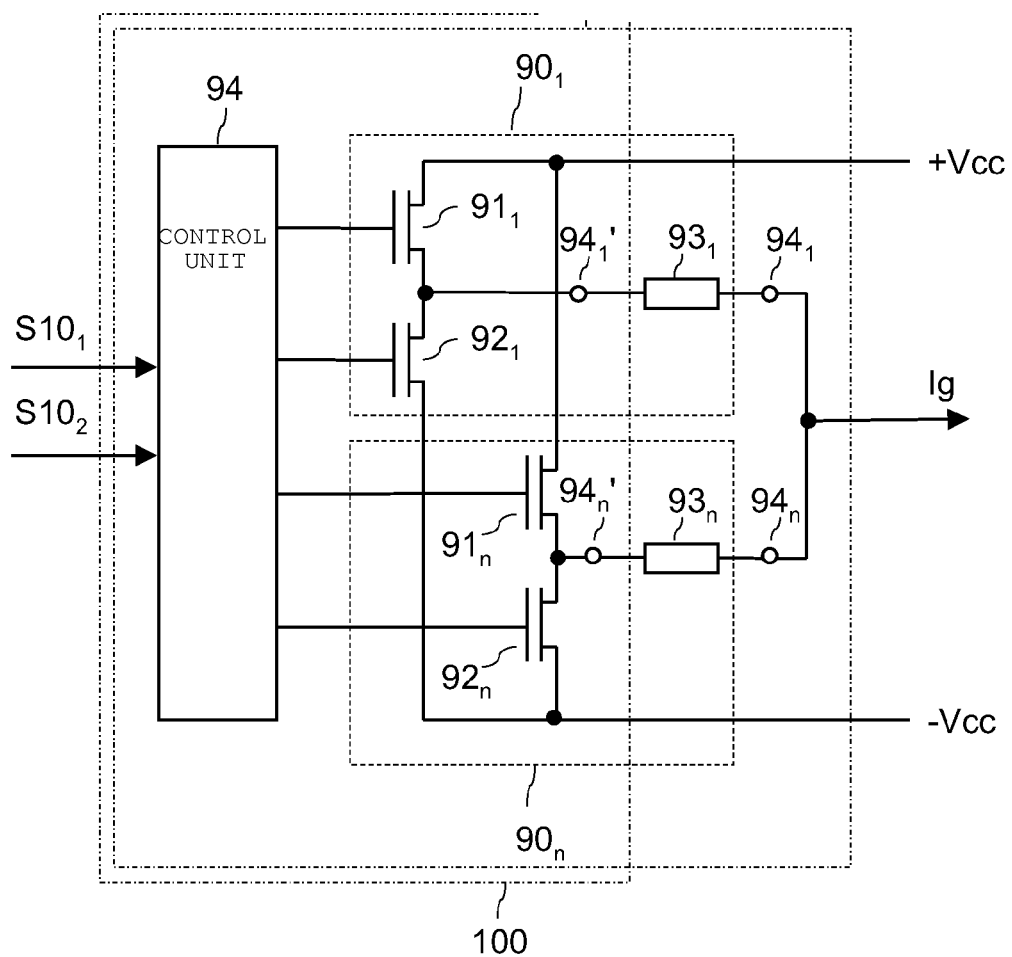
FIG. 18 illustrates a modification of the drive circuit of FIG. 17.

According to a further embodiment, illustrated in FIG. 18, the resistive elements $93_1$, $93_2$ are external components. That is, the resistive elements $93_1$, $93_2$ are discrete (not integrated) devices that are located outside the semiconductor body (that is schematically illustrated by line 100). In this case, the resistive elements $93_1$, $93_2$ are a choice of the user and can be adapted dependent on the specific use of the driver circuit. In FIG. 18, reference characters $94_1'$, $94_2'$ denote output terminals of the semiconductor body (semiconductor chip) in which the transistors of the driver units $90_1$, $90_2$ and the control circuit 94 are integrated. In this case, the drive units $90_1$, $90_2$ include integrated transistors and external resistive elements $93_1$, $93_2$.

Figure 19:
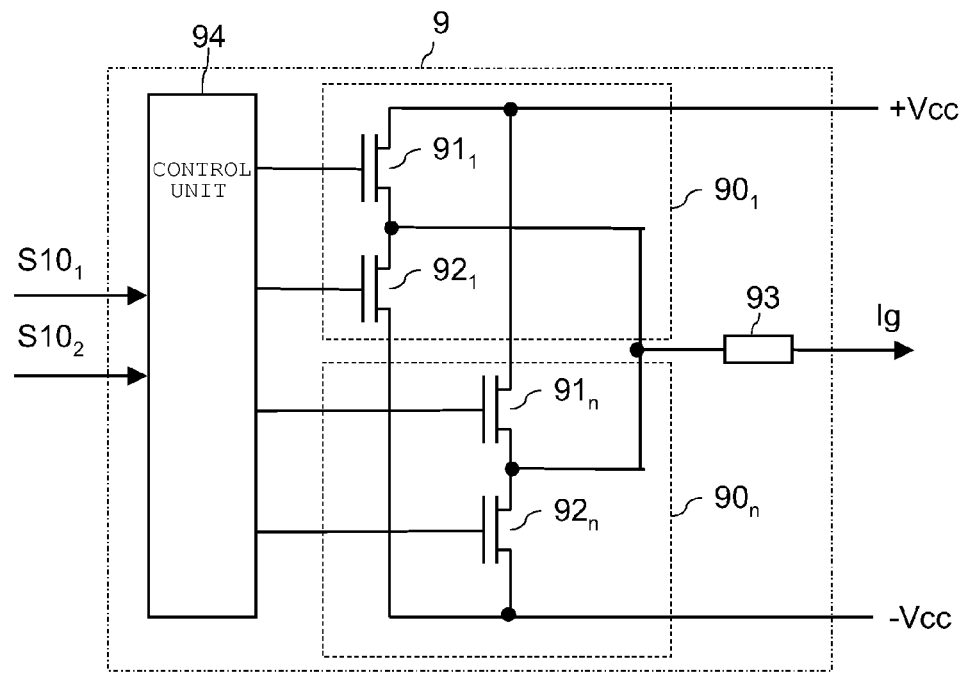
FIG. 19 illustrates a second embodiment of the drive circuit of FIG. 16.

FIG. 19 illustrates a further embodiment of the drive circuit 9. In this drive circuit, the driver stages $90_1$, $90_n$ share the resistive element 93. That is, the resistive element 93 is connected between the output of the drive circuit 9 and the outputs $94_1$, $94_n$ of the individual driver stages $90_1$, $90_n$. In this drive circuit, the current level of the actuation current Ig can be varied by varying the number of driver stages $90_1$, $90_n$ that are active. A driver stage is active, when one of the switching elements of the driver stage is switched on. Each of the switching elements has an on-resistance, which is the electrical resistance of the switching element in the on-state. Thus, not only the resistive element 93 but also the number of switching elements that are switched on defines the actuation current Ig. E.g., the actuation current Ig increases when the number of activated driver stages $90_1$, $90_n$ increases. In the embodiment of FIG. 18, two different actuation current levels can be adjusted for both switching on and switching off the transistor. For switching on the transistor, a first current level can be adjusted by switching on the first switching element $91_1$, $91_n$ of one of the first and second driver stages $90_1$, $90_n$, and a second current level can be adjusted by switching on both of the first switching elements $91_1$, $91_n$, wherein the second current level is lower than the first current level. Equivalently, a first current level for switching off can be adjusted by switching on one of the second switching elements $92_1$, $92_n$, while a second current level can be adjusted by switching on both of the second switching elements $92_1$, $92_n$. In the embodiments of FIGS. 17 and 18, resistances the resistive elements are significantly higher than on-resistances of the transistors of the driver units $90_1$, $90_2$, such as at least 5 to 10 times higher than the on-resistances. In the embodiment of FIG. 19, the resistance of the resistive element is in the range of the on-resistances of the transistors of the driver units, such as between 0.5 times and 2 times the on-resistance of one transistor. Thus, a variation of the number of active driver units significantly varies the overall output resistance of the driver circuit 9.

The resistive element 90 can be an integrated device (like in the embodiment of FIG. 17) or an external (discrete) device (like in the embodiment of FIG. 18).

Figure 20:
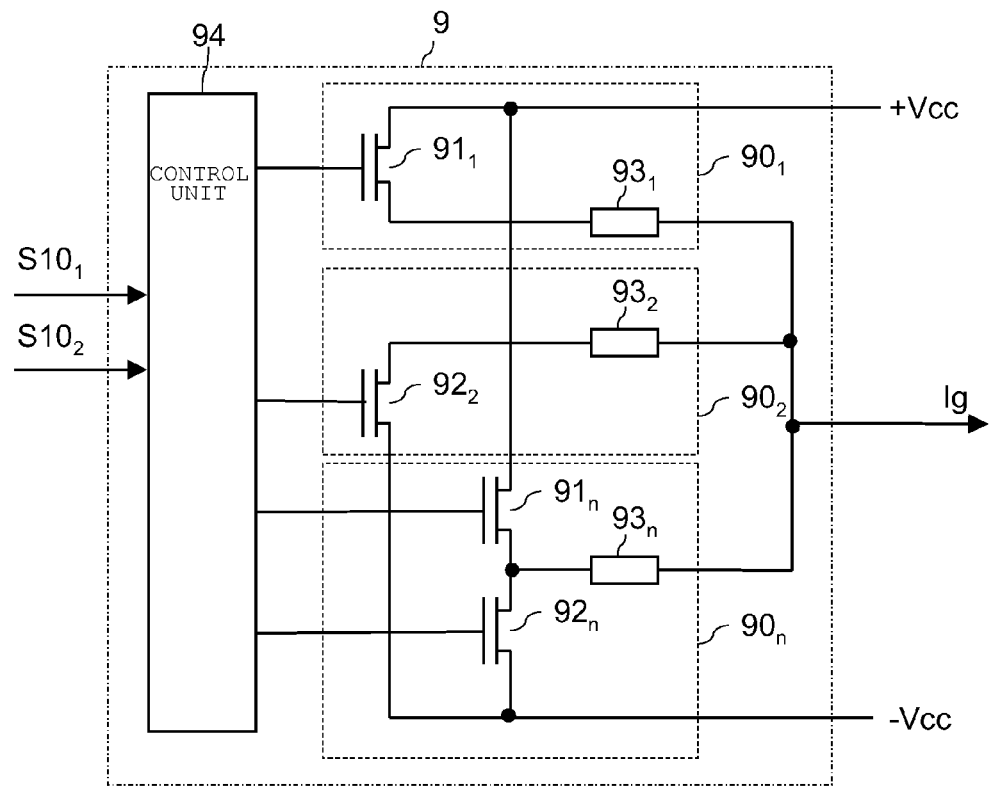
FIG. 20 illustrates a third embodiment of the drive circuit of FIG. 16.

FIG. 20 illustrates a further embodiment of a drive circuit 9. The drive circuit of FIG. 19 includes three driver stages $90_1$, $90_2$, $90_n$. A first one of these driver stages is only for switching on and has a first switching element $91_1$ connected in series with a first resistive element $93_1$ between the terminal for the positive actuation potential +Vcc and an output $94_1$. A second drive circuit $90_2$ is only for switching off and has a second switching element $92_2$ connected in series with a resistive element $93_2$ between the terminal for the negative actuation potential −Vcc and an output $94_2$. A third driver stage $90_n$ is for switching on and switching off and corresponds to one of the driver stages explained with reference to FIG. 17. The direction of the actuation current Ig as well as the current level of the actuation current Ig can be adjusted by suitably activating at least one of the three driver stages $90_1$, $90_2$. The resistances of the resistive elements $93_1$, $93_2$, $93_n$ may be different.

The resistive elements $90_1$, $90_2$ can be integrated devices (like in the embodiment of FIG. 17) or external (discrete) devices (like in the embodiment of FIG. 18).

FIGS. 16 through 20 illustrate the functionality of the activation current source 7 rather than the implementation. The individual function blocks illustrated in FIGS. 16 through 19, such as the control circuit 10 and the control unit 94, may be implemented using a conventional technology that is suitable to implement the control circuit 10 and the control unit 94. Specifically, these function blocks may be implemented as analog circuits, digital circuits, or may be implemented using hardware and software, such as a microcontroller on which a specific software is running in order to implement the functionality of the control circuit 10 and the control unit 94.

In each of the embodiments explained before, the drive current (gate current Ig) decreases as the load current increases.

It should be pointed out that the circuit arrangements and methods explained above can be modified such that the actuation current for turning on the transistor, i.e. the turn-on current level, and the actuation current for turning off the transistor, i.e. the turn-off current level, can be set independently of one another. It is thus possible, by way of example, to set the actuation current only for one of the cited switching processes (turning on or turning off) or for both switching processes on the basis of the load current, the load path voltage or the duty cycle.

Finally, it should be pointed out that method or component features which have been explained only within the context of one example can also then be combined with method or component features from other examples even if this has not been explained explicitly beforehand. Thus, in one embodiment, features which are reproduced in one of the claims which follow can be combined with features from any other claims.

Although specific embodiments have been illustrated and described herein, it will be appreciated by those of ordinary skill in the art that a variety of alternate and/or equivalent implementations may be substituted for the specific embodiments shown illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:
   an input configured to receive an input signal, and an actuation output configured to be connected to an actuation terminal of a transistor;
   a measurement arrangement configured to ascertain at least one of a load current through a load path of the transistor, and a load voltage across the load path of the transistor and to provide a measurement signal that is dependent on at least one of the load current and the load path voltage; and
   an actuation current source configured to receive the measurement signal and to provide an actuation current at the actuation output, the actuation current having a current level dependent on the measurement signal,
   wherein a magnitude of the actuation current increases as the load current or the load voltage represented by the measurement signal decreases.

2. The circuit of claim 1, wherein the actuation current source comprises:
   a control circuit configured to receive the input signal and the measurement signal, and to provide at least one control signal dependent on the input signal and the measurement signal; and
   a drive circuit configured to receive the at least one control signal and comprising at least two driver stages, each driver stage having at least one output, each output coupled to the activation output.

3. The circuit of claim 2, wherein the drive circuit further comprises:
   a control unit configured to receive the at least one control signal and to activate at least one of the at least two driver stages dependent on the at least one control signal.

4. The circuit of claim 3, wherein the control circuit and the control unit are configured to activate the driver stages in such a way that the magnitude of the actuation current increases as the load current or the load voltage represented by the measurement signal decreases.

5. The circuit of claim 2, wherein each driver stage comprises:
   at least one switching element coupled between one of a terminal for a positive actuation potential and a terminal for a negative actuation potential and the output of the driver stage.

6. The circuit of claim 5, wherein at least one of the at least two driver stages further comprises:
   at least one further switching element coupled between the other one of the terminal for the positive actuation potential and the terminal for the negative actuation potential and the output of the driver stage.

7. The circuit of claim 5, further comprising:
   a resistive element connected between the outputs of the at least two driver stages and the actuation output.

8. The circuit of claim 5, wherein each driver stage comprises:
   a resistive element connected between the at least one switching element and the output of the driver stage.

9. A circuit comprising:
   a transistor having a load path and a control terminal;
   a measurement arrangement configured to ascertain one of a load current through a load path of the transistor, and a load voltage across the load path of the transistor and to provide a measurement signal; and
   an actuation current source configured to receive the measurement signal and an input signal and to provide an actuation current at the actuation output, the actuation current having a current level dependent on the measurement signal,
   wherein a magnitude of the actuation current increases as the load current or the load voltage represented by the measurement signal decreases.

10. The circuit of claim 9, wherein the actuation current source comprises:
    a control circuit configured to receive the input signal and the measurement signal, and to provide at least one control signal dependent on the input signal and the measurement signal; and
    a drive circuit configured to receive the at least one control signal and comprising at least two driver stages, each driver stage having at least one output, each output coupled to the activation output.

11. The circuit of claim 10, wherein the drive circuit further comprises:
    a control unit configured to receive the at least one control signal and to activate at least one of the at least two driver stages dependent on the at least one control signal.

12. The circuit of claim 11, wherein the control circuit and the control unit are configured to activate the driver stages in such a way that the magnitude of the actuation current increases as the load current or the load voltage represented by the measurement signal decreases.

13. The circuit of claim 10, wherein each driver stage comprises:

at least one switching element coupled between one of a terminal for a positive actuation potential and a terminal for a negative actuation potential and the output of the driver stage.

14. The circuit of claim 13, wherein at least one of the at least two driver stages further comprises:
at least one further switching element coupled between the other one of the terminal for the positive actuation potential and the terminal for the negative actuation potential and the output of the driver stage.

15. The circuit of claim 13, further comprising:
a resistive element connected between the outputs of the at least two driver stages and the actuation output.

16. The circuit of claim 13, wherein each driver stage further comprises:
a resistive element connected between the at least one switching element and the output of the driver stage.

* * * * *